United States Patent [19]

Court

[11] 3,947,787
[45] Mar. 30, 1976

[54] MECHANICAL TV CONTROL UNIT

[75] Inventor: Patrick R. J. Court, Los Angeles, Calif.

[73] Assignee: Oak Industries Inc., Crystal Lake

[22] Filed: Dec. 26, 1974

[21] Appl. No.: 536,350

[52] U.S. Cl. .................. 334/51; 334/57; 334/88
[51] Int. Cl.² ..................................... H03J 5/30
[58] Field of Search ......................... 334/2–3, 40, 334/50–51, 57–58, 74, 76, 88

[56] References Cited
UNITED STATES PATENTS

| | | | |
|---|---|---|---|
| 2,323,376 | 7/1943 | Harvey | 334/40 |
| 2,821,622 | 1/1958 | Thias | 334/2 |
| 2,821,624 | 1/1958 | Koch | 334/88 |
| 3,249,902 | 5/1966 | Warthan et al. | 334/50 |
| 3,593,226 | 7/1971 | Weigel | 334/50 |

Primary Examiner—Alfred E. Smith
Assistant Examiner—Wm. H. Punter
Attorney, Agent, or Firm—Kinzer, Plyer, Dorn & McEachran

[57] ABSTRACT

A television tuner includes a rotatable turret and a plurality of coil forms positioned in the turret. There is a pair of tuning coils mounted on each coil form and an adjustable tuning screw extending outwardly from each end of each coil form. The housing mounting the rotatable turret includes means for adjusting the tuning screws at opposite ends of each coil form. The turret is detented within its housing such that there are twice as many detented positions of the turret as there are coil forms and such that at each detented position only one tuning screw can be adjusted.

22 Claims, 5 Drawing Figures

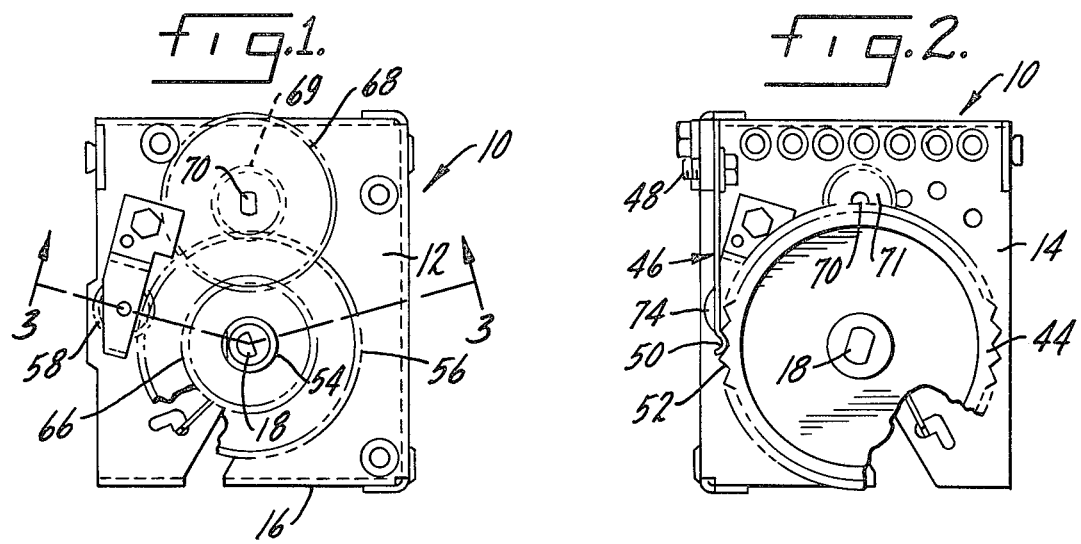
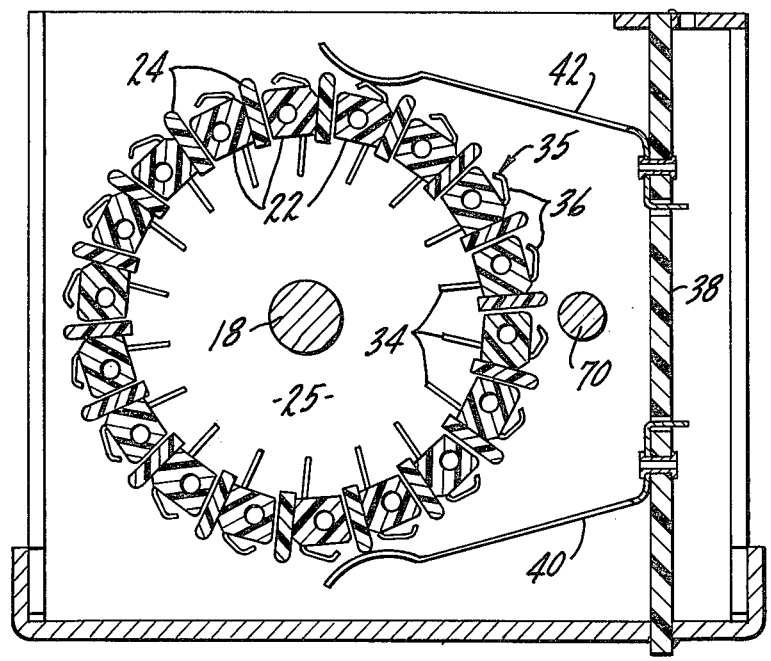

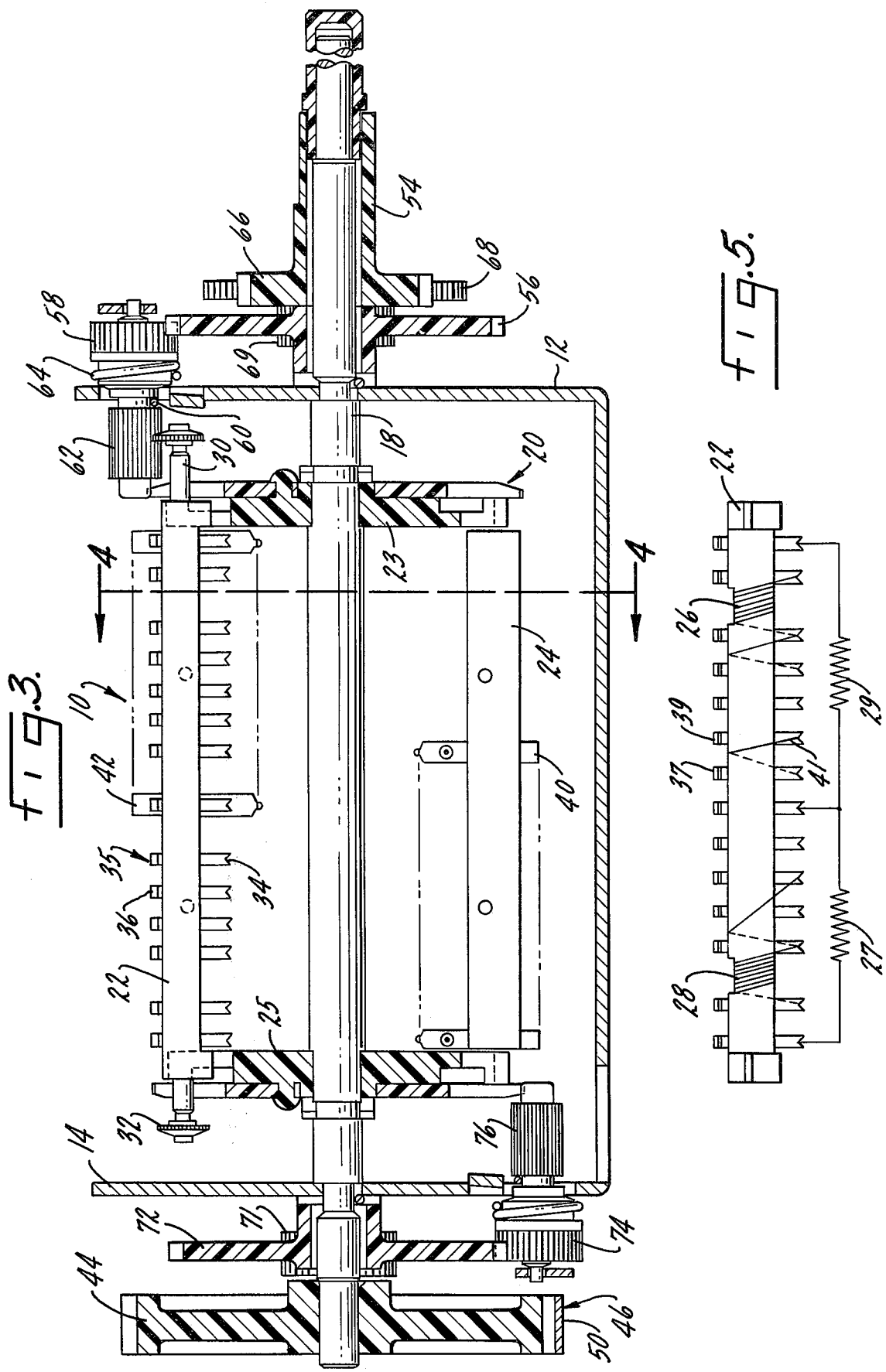

MECHANICAL TV CONTROL UNIT

SUMMARY OF THE INVENTION

The present invention relates to the field of television tuners and particularly to means for providing channel selection and fine tuning voltages for a varactor television tuner.

Another purpose is a tuning means of the type described which provides parity between VHF and UHF channels.

Another purpose is a turret-type TV tuner utilizing coil sticks in which each coil stick has two tuning coils and adjusting means at each end of each coil stick.

Another purpose is a structure of the type described having a detent arrangement in which there are twice as many detented positions as there are coil sticks, with each coil stick carrying two tuning coils.

Another purpose is a TV tuning arrangement of the type described which includes means for varying the Q of each tuning coil.

Another purpose is a means for providing television tuning voltages which includes a plurality of coil sticks, a pair of tuning coils mounted on each stick, and means at each end of a turret housing for adjusting the Q of each coil.

Other purposes will appear in the ensuing specification, drawings and claims.

BRIEF DESCRIPTION OF THE DRAWINGS

The invention is illustrated diagrammatically in the following drawings wherein:

FIG. 1 is a front view of the tuner housing,

FIG. 2 is a back view of the tuner housing,

FIG. 3 is an enlarged vertical section along plane 3—3 of FIG. 1,

FIG. 4 is a section along plane 4—4 of FIG. 3, and

FIG. 5 is a plan view of a coil stick used in the turret disclosed herein.

DESCRIPTION OF THE PREFERRED EMBODIMENT

It is conventional practice in providing channel selection and fine tuning voltages for varactor diodes to utilize potentiometers, one for each channel or switch position. However, the cost of the potentiometers becomes prohibitive when there is an attempt to provide the same basic channel selection and tuning for VHF and UHF channels. Although the present invention should not be limited to any particular number of switch positions, a 36-position switch arrangement has been found to be practical, as it provides for 12 VHF positions and 24 UHF positions. With three UHF channels allotted to each position, the entire band of 70 UHF channels and 12 VHF channels can be covered in a single switching mechanism.

The fine tuning voltage for both the VHF and UHF channels may be provided by Q variable inductances. The Q variation is obtained by substituting cold rolled steel adjusting screws in place of the aluminum screws which are customarily used in a conventional memory fine tuning mechanism for varying the tuner oscillator frequency. Cold roller steel has a resistivity which is relatively high in comparison and, when used as an adjustable core material, the resultant power dissipation caused by the induced eddy currents in the core is reflected back as an apparent loading resistance. The Q of the coil is therefore substantially reduced. At the same time, however, cold rolled steel has a permeability in excess of unity, which creates an increase of inductance of the coil which approximately cancels out the decrease of inductance due to the short circuit turns effect of the solid metal core, with the net result that the inductance change due to the core is almost zero. Only the Q varies significantly as a function of the position of the core within the coil.

By providing a generally constant frequency signal, and by coupling this signal to a sensing circuit which includes a Q variable inductance, it is possible to vary the amplitude of the oscillator signal in accordance with core position and thus to control the output voltage from the sensing circuit which is subsequently rectified and used as a fine tuning voltage.

The above-described circuit is specifically claimed in my co-pending application. The present invention relates to the mechanical design of the channel selection switch.

The mechanical tuner arrangement provides for 36 detented positions of the turret and 18 coil sticks or coil forms, each with two coils wound about it. There are tuning screws extending outwardly from each end of each coil stick and there are fine tuning means at each end of the housing supporting the turret. The contacts for the coil sticks and the fine tuning means are so arranged that at each position of the detented turret only one adjusting screw will be arranged for fine tuning and the contacts on only one coil form will be positioned for contact by electrical contact arms.

In FIGS. 1 and 2 housing is indicated generally at 10 and may include a front wall 12, a rear wall 14 and a bottom 16. Rotatably journaled in the front and rear walls 12 and 14 is a rotatable shaft 18. The shaft 18 mounts a turret indicated generally at 20.

Circumferentially positioned about and fastened to the turret 20 are a plurality of coil sticks or coil forms indicated at 22 and shown in detail in FIG. 5. Support discs 23 and 25 at opposite ends of the turret support the coil forms. As clearly shown in FIG. 4, there is an insulation strip or bar or cam 24 positioned between each pair of adjacent coil forms.

Each coil form may include a pair of coils. Looking particularly at FIG. 5, one such coil is indicated at 26 with the other being indicated at 28. Each coil form includes a pair of cold rolled steel adjusting screws, one such screw being indicated at 30 in FIG. 3 and the other being indicated at 32. The adjusting screws extend outwardly from opposite ends of the coil forms.

There are a plurality of terminals 35 which extend through each of the coil forms and each has a wire receiving notch 34 on the inner radial side and a contact receiving portion 36 on the opposite or other radial side. The notches 34 will be used in positioning and winding the coils 26 and 28 about the coil form.

There are a pair of voltage divider resistors indicated at 27 and 29 (FIG. 5) which are connected to three of the terminals 35 on the coil forms. Thus, the coil forms not only carry the coils themselves, but also voltage divider resistors which may be used to provide the platform voltages for VHF and UHF tuning. In addition, as particularly shown in FIG. 5, there are a pair of adjacent contacts indicated at 37 and 39 which are connected by a single wire 41. Thus, those contacts not directly connected to the coils 26 and 28 may be used to provide various switching functions. For example, UHF/VHF B+ switching, as well as VHF high and low band switching, may be accomplished by other portions of the coil forms. Thus, the coil forms perform multiple functions, i.e. providing a means for carrying voltage divider resistors, providing a support for the tuning coils, as well as providing the various switching functions for the tuner.

Looking particularly at FIG. 4, the housing 10 may include a mounting board 38, which may be a printed circuit board containing a number of circuit elements. The board 38 mounts two sets of long flexible cantilever contact arms, one such set being indicated at 40 and the other set being indicated at 42. The set of contact arms 40 are positioned against an insulation strip 24, whereas, the set of arms 42 are positioned against the contact arm receiving portions 36 of the terminals extending outwardly from a particular coil form.

A detent wheel is indicated at 44 (FIG. 3) and, as indicated above, may have twice as many detent positions as there are coil forms. Thus, each coil form will have two detented positions. In one position the tuning screw 30 at the front end of the coil form may be adjusted, whereas, at another position the tuning screw 32 at the rear end of the coil form may be adjusted. A detent spring is indicated at 46 in FIG. 2 and is fastened to the housing by a suitable screw or the like 48 and has a curved portion 50 which fits within the adjacent notches 52 of the detent wheel 44.

As shown in FIG. 3, the rotatable channel selection shaft 18 mounts a fine tuning shaft 54 which is concentric with the shaft 18 and rotatable relative thereto. The fine tuning shaft 54 drives a fine tuning gear 56 which in turn is positioned to drive a rotatable tuning member 58. Shaft 54 has a gear portion 66 which is in mesh with a gear 68 mounted on offset shaft 70. Also mounted on shaft 70 is a small gear 69 which drives fine tuning gear 56. A spring 60, mounted behind the front wall 12 of the housing, normally biases a pinion 62, part of the fine tuning member 58, out away from a tuning screw 30. The member 58 has a coil spring or clutch member 64 wrapped around it, with the opposite ends of the spring being in contact with portions of the front wall 12 of the housing. Details of this structure are shown in copending Ser. No. 414,326, filed Nov. 9, 1973.

The coil spring 64 functions as a clutch. Initial rotation of member 58, caused by fine tuning gear 56, will cause the member 58 to pivot to the position shown in FIG. 3 in which pinion 62 is in contact with screw 30. After the initial movement to a a position in which fine tuning can occur, further rotation of gear 56 will cause rotation of member 58, and thus pinion 62, to adjust the fine tuning screw 30. As indicated above, this movement for the front screws will only take place at alternate detented positions of the turret.

Offset fine tuning adjustment shaft 70 extends between the front and rear walls 12 and 14. Thus, rotation of fine tuning shaft 54, which will cause rotation of fine tuning gear 56, will also cause rotation of shaft 70 which, through a gear 71, is in rotatable engagement with rear fine tuning gear 72. Fine tuning gear 72 is identical with fine tuning gear 56 and similarly is arranged to cause rotation of a tuning member 74 having a pinion 76 which can be positioned for engagement with tuning screws 32. Thus, wherever fine tuning shaft 54 is rotated, both tuning gears 56 and 72 will rotate through shaft 70 and their respective tuning members and tuning pinions 62 and 76 will be moved through the clutch springs toward a fine tuning screw. However, there will only be a fine tuning screw positioned for adjustment at one end of the turret. In the next position of the turret the fine tuning screw at the opposite end of the turret will be positioned for adjustment.

As indicated above, there are two sets of contact arms, indicated at 40 and 42. When a particular coil stick has its terminals in contact with one set of arms, for example the set 42 as indicated in FIG. 4, the opposite set of arms 40 will bear against an insulation strip 24. The particular coil form which is thus electrically connected into the tuner circuit will also have its adjustment screw positioned for engagement by an appropriate fine tuning member. At the next position of the turret a different coil form will have its screw positioned for adjustment and the contact arm set 40 will be in contact with that particular coil form's terminals.

Thus, within a single rotatable turret having a predetermined number of coil forms or coil sticks, it is possible to have twice that many tuning positions. this is accomplished by having two coils on each coil form and fine tuning elements at opposite ends of the turret.

Whereas the preferred form of the invention has been shown and described herein, it should be realized that there may be many modifications, substitutions and alterations thereto.

The embodiments of the invention in which an exclusive property or privilege is claimed are defined as follows:

1. A means for providing TV tuning signals including a housing, a turret rotatable in said housing, a plurality of coil forms mounted on said turret for rotation therewith, a pair of tuning coils on each coil form, independent adjustable tuning means at each end of each coil form,
    a rotatable shaft extending outwardly from said housing for use in rotating said turret, cooperating detent means on said shaft and housing,
    and means operable from one end of said housing for effecting individual independent rotation of said adjustable tuning means.

2. The structure of claim 1 further characterized in that said coils are wound generally adjacent opposite ends of each coil form, said adjustable tuning means including adjustable screw elements extending outwardly from opposite ends of each coil form.

3. The structure of claim 2 further characterized in that each of said screw elements includes a steel portion for use in varying the Q of its associated coil.

4. The structure of claim 1 further characterized in that each of said coil forms includes radially outwardly extending contact means, and a plurality of contact arms attached to said housing and positioned for engagement with said contact means.

5. The structure of claim 4 further characterized by and including two sets of contact arms, with each set of contact arms being positioned for engagement with alternate coil forms.

6. The structure of claim 5 further characterized by and including insulation strips positioned between adjacent coil forms and extending radially outwardly from said turret, said insulation strips being positioned for engagement with alternate sets of contact arms, such that at one detented position of said turret, one set of contact arms is in engagement with said contact means on a particular coil form, with the other set of said contact arms being in engagement with an insulation strip.

7. The structure of claim 6 further characterized in that said sets of contact arms are positioned, within said housing, for engagement with generally opposed portions of said turret.

8. The structure of claim 1 further characterized in that there is an adjustable tuning means extending outwardly from each end of each coil form, means mounted at each end of said housing for effecting individual rotation of said adjustable tuning means.

9. The structure of claim 8 further characterized by and including a shaft journaled in said housing and connecting said means for rotating said adjustable tuning means.

10. The structure of claim 8 further characterized by and including means mounted on said rotatable turret shaft for causing rotation of said means for rotating said adjustable tuning means.

11. The structure of claim 1 further characterized in that there are twice as many detented positions of said turret as there are coil forms.

12. The structure of claim 11 further characterized by and including an adjustable tuning screw extending outwardly from each end of each coil form, and a rotating gear at each end of the housing positioned for engagement with a tuning gear, the rotating gear at one end of the housing being positioned for engagement with tuning screws at alternate detented positions of said turret, with the rotating gear at the opposite end of the turret being positioned for engagement with the alternate other tuning screws, such that at each detented position of the turret, only one rotating gear is positioned for engagement with a tuning screw.

13. The structure of claim 12 further characterized by shaft means connecting said rotating gears.

14. The structure of claim 13 further characterized by and including a tuning member concentric with and mounted on said rotating turret shaft, rotation of said tuning member causing rotation of said shaft means.

15. The structure of claim 12 further characterized by and including clutch means mounted with each of said rotating gears, and spring means adjacent each of said rotating gears normally biasing said gears away from said tuning screws.

16. The structure of claim 1 further characterized by and including a plurality of contacts extending outwardly from each coil form, resistor means connected between contacts on each coil form.

17. The structure of claim 16 further characterized in that a pair of said contacts are interconnected for use in performing switching functions by the coil forms.

18. The structure of claim 17 further characterized in that said tuning coils are connected to contacts other than said interconnected contacts and said contacts connected to said resistor means.

19. A means for providing TV tuning voltages including a housing, a turret rotatable in said housing, a rotatable shaft extending outwardly from said housing for use in rotating said turret, detent means for positioning said turret and shaft within said housing, a plurality of coil forms mounted on said turret for rotation therewith, there being twice as many detented positions of said turret as there are coil forms, a pair of tuning coils wound about opposite ends of each coil form, adjusting screws extending outwardly from each end of each coil form, and means, mounted on each end of said housing, for causing rotation of said adjusting screws.

20. The structure of claim 19 further characterized by and including steel portions for said adjusting screws for varying the Q of each coil.

21. The structure of claim 19 further characterized by and including two sets of contact arms mounted on said housing and extending toward said turret, a plurality of insulating strips, one such strip being positioned between each pair of adjacent coil forms, in each detented position of said turret, one set of contact arms being positioned for contact with an insulating strip and the other set of contact arms being positioned for contact with a foil form.

22. The structure of claim 19 further characterized by and including means at one end of said housing for causing rotation of said means, mounted on each end of said housing, for rotating said adjusting screws.

* * * * *